United States Patent
Eastman et al.

[19]

[11] Patent Number: 6,150,680
[45] Date of Patent: Nov. 21, 2000

[54] FIELD EFFECT SEMICONDUCTOR DEVICE HAVING DIPOLE BARRIER

[75] Inventors: Lester Fuess Eastman; James Richard Shealy, both of Ithaca, N.Y.

[73] Assignee: Welch Allyn, Inc., Skaneateles Falls, N.Y.

[21] Appl. No.: 09/035,475

[22] Filed: Mar. 5, 1998

[51] Int. Cl.[7] .................................................... H01L 29/72
[52] U.S. Cl. .......................... 257/224; 257/217; 257/243; 257/279; 257/282; 257/376; 257/394
[58] Field of Search .................................... 257/224, 243, 257/279, 376, 217, 282, 394

[56] References Cited

U.S. PATENT DOCUMENTS

| | | |
|---|---|---|
| 4,425,573 | 1/1984 | Ristow . |
| 4,740,822 | 4/1988 | Itoh . |
| 4,795,717 | 1/1989 | Okamura . |
| 4,814,836 | 3/1989 | Thompson ................................ 357/22 |
| 4,829,346 | 5/1989 | Kasahara et al. ......................... 357/22 |
| 4,843,155 | 6/1989 | Chomczynski . |
| 4,866,490 | 9/1989 | Itoh . |
| 4,908,325 | 3/1990 | Berenz . |
| 4,952,527 | 8/1990 | Calawa et al. . |
| 5,043,777 | 8/1991 | Sriram . |
| 5,087,950 | 2/1992 | Katano . |
| 5,164,686 | 11/1992 | Shiga . |
| 5,262,660 | 11/1993 | Streit et al. . |
| 5,270,798 | 12/1993 | Pao et al. ................................ 257/134 |
| 5,399,886 | 3/1995 | Hasegawa . |
| 5,399,887 | 3/1995 | Weitzel et al. . |
| 5,406,099 | 4/1995 | Hiramatsu . |
| 5,408,111 | 4/1995 | Nakajima et al. . |
| 5,410,167 | 4/1995 | Saito . |
| 5,411,914 | 5/1995 | Chen et al. . |
| 5,448,085 | 9/1995 | Calcatera et al. . |
| 5,448,086 | 9/1995 | Hida . |

(List continued on next page.)

FOREIGN PATENT DOCUMENTS

| | | |
|---|---|---|
| 0 196 517 | 10/1986 | European Pat. Off. . |
| 0 334 006 | 9/1989 | European Pat. Off. . |
| 0 518 683 A1 | 12/1992 | European Pat. Off. . |
| 0 522 943 A1 | 1/1993 | European Pat. Off. . |
| 61-268069 | 11/1986 | Japan . |
| 1 509 363 | 5/1978 | United Kingdom . |

OTHER PUBLICATIONS

Shenai et al. ("Current Transport Mechanisms in Atomically Abrupt Metal–Semiconductor Interfaces", IEEE Transactions on Electron Devices, vol. 35, No. 4, Apr. 1988, pp. 468–482).

Kenji Hiruma et al.: "Dependence of GaAs–$Al_x Ga_{1-x}A$ s Heterostructures on Al Composition For Metal–Semiconductor Field–Effect Transistor Operation" Journal of Applied Physics, vol. 66, No. 3, Aug. 1, 1989, pp. 1430–1443, XP000039863 see p. 1440, column 2, line 21, paragraph III line 25.

Hiromi Tsuji et al.: "A Sub–10 ps/gate Direct–Coupled FET Logic Circuit With 0.2 Um—Gate GaAs MESFET " Japaneses Journal of Applied Physics, vol. 29, No. 12 Part 02, Dec. 1, 1990, pp. L2438–L2441, XP000222808 see Figure 2.

Cho H –R et al.: "A New GaAs Field Effect Transistor (FET) With Dipole Barrier (DIB)" Japanese Journal of Applied Physics, vol. 33, No. 1B, Part 01, Jan. 1, 1994, pp. 775–778, XP000596422 see p. 775, paragraph 2; Figure 1A.

Ping A T et al.: "DC and Microwave Performance of High–Current AlGaN–GaN Heterostructure Field Effect Transistors Grown On p–Type SiC Substrates" IEEE Electron Device Letters, vol. 19, No. 2, Feb. 1, 1998, pp. 54–56, XP000727959 see abstract.

*Primary Examiner*—Edward Wojciechowicz
*Attorney, Agent, or Firm*—Wall Marjama & Bilinski

[57] ABSTRACT

A field effect semiconductor device including a substrate, a dipole barrier formed on the substrate, a channel layer formed on the dipole barrier, and source, gate and drain electrodes formed on the channel layer. The dipole barrier provides a potential barrier and a maximum electric field sufficient to confine electrons to the channel layer.

39 Claims, 3 Drawing Sheets

U.S. PATENT DOCUMENTS

| | | |
|---|---|---|
| 5,459,089 | 10/1995 | Baliga . |
| 5,493,136 | 2/1996 | Matsuzaki et al. . |
| 5,504,352 | 4/1996 | Tsutsui et al. . |
| 5,504,353 | 4/1996 | Kuzuhara . |
| 5,539,228 | 7/1996 | Chi . |
| 5,578,512 | 11/1996 | Tao . |
| 5,693,964 | 12/1997 | Ohta et al. . |

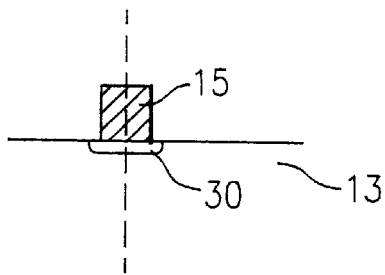
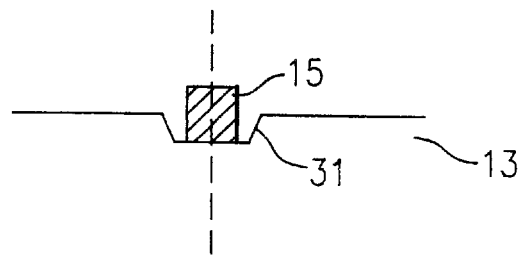
FIG.5a                FIG.5b
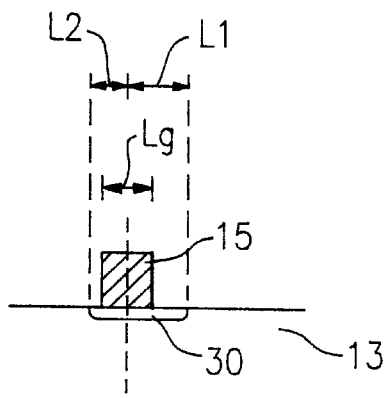
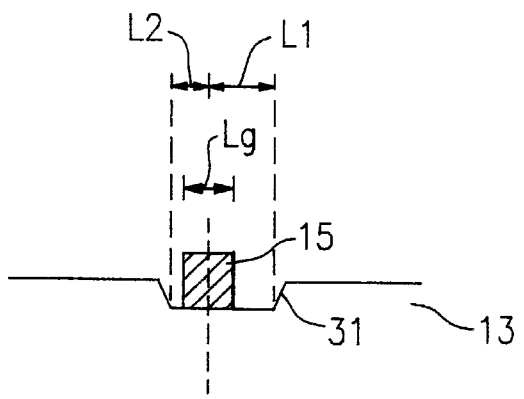
FIG.6a                FIG.6b

FIELD EFFECT SEMICONDUCTOR DEVICE HAVING DIPOLE BARRIER

FIELD OF THE INVENTION

The present invention relates to a field effect semiconductor device (e.g., field effect transistor) that incorporates a dipole barrier between the substrate and channel layer of the device to prevent parasitic current flow in the substrate or in a thick, pure buffer layer used to isolate the substrate, especially under high voltage conditions.

BACKGROUND OF THE INVENTION

Semiconductor manufacturers have used various types of materials to make field effect devices, such as metal semiconductor field effect transistors (MESFETs), that are able to satisfy a wide variety of specific electronic design applications. Gallium Arsenide (GaAs) and Indium Phosphide (InP) semi-insulating materials have been widely used in the manufacture of lateral MESFETs. More recently, Silicon Carbide (SiC) and Gallium Nitride (GaN) have been investigated as promising materials for lateral MESFETs. While GaAs works well in most low voltage MESFET applications, its semi-insulating substrate has an inherent defect which limits the critical electric field strength corresponding to breakdown. For example, FETs made on semi-insulating GaAs tend to breakdown at drain to source voltages of less than 35 volts. When the gate potential in such a FET is applied to pinch off current flow from the source to the drain in the channel layer of the device and a high drain to source bias voltage is applied, fringing electric fields extend into the underlying GaAs semi-insulating substrate. That is, parasitic current flow occurs in the GaAs semi-insulating substrate at source to drain voltages in excess of about 35 volts.

The above-discussed material limitation makes GaAs unsuitable for high voltage applications in lateral MESFETs. Consequently, GaAs MESFETS cannot be used to generate high power at high voltage in conjunction with high impedance RF load applications, such as commercial microwave heaters, electrodeless lamps and base station cellular phone systems. While the current flow through a GaAs MESFET can be increased substantially for increased power by increasing the device periphery, impedance matching of such loads as mentioned above becomes difficult (inefficient impedance transformers are generally required). Extending the voltage capability of the device will allow higher RF voltage swings which will yield high power operation while maintaining impedance matching for commonly encountered loads without the use of transformers.

The inability of GaAs semiconductor material to isolate current flow to the channel region of the MESFET is a main reason why it has not yet been widely adopted for high voltage applications. Tens of millions of research dollars have been spent with respect to GaAs in an attempt to develop this material as a substrate for high voltage semiconductors, such as high voltage FETs. However, the industry has not been able to overcome the inherently low withstand voltage of GaAs "semi-insulating" substrates.

It would be desirable to use GaAs as a substrate for high power semiconductor devices. However, the inherent defects or impurities of GaAs that lead to low breakdown electric fields, as discussed above, present major obstacles for its widespread adoption in the high voltage semiconductor field.

It would also be desirable to use other materials, such as SiC, GaN and InP, in high voltage semiconductor applications. However, these materials are also unable to confine electron flow to the channel region of the device at high operating voltages.

SUMMARY OF THE INVENTION

It is an object of the present invention to provide a field effect semiconductor device that can make use of materials such as GaAs, SiC, GaN and InP in high voltage applications, while maintaining confinement of carrier (e.g., electron) flow substantially only to the channel region of the device. The inventors discovered that the inherent material defects discussed above can be circumvented by the use of a novel dipole barrier interposed between the substrate and channel regions of a MESFET. The dipole barrier sets up an electronic barrier between the channel region and substrate to confine electron flow substantially only to the channel region of the field effect device. The dipole barrier has a built in barrier potential (eV) and maximum electric field (V/cm) sufficient to (a) prevent carrier flow to the semi-insulating substrate, (b) prevent carrier release from high fringing electric fields in the semi-insulating substrate, and (c) maintain relatively low output conductance.

The dipole barrier can be used directly on the surface of substrate materials that have sufficient breakdown voltage to provide a field effect device capable of handling high voltages with electron flow confined to the channel region of the device. SiC is an example of a material that has sufficiently high breakdown voltage. The dipole barrier also can be used on a GaAs semi-insulating substrate, but due to the low breakdown voltage of "semi-insulating" GaAs, a relatively thick, substantially pure buffer layer must also be interposed between the GaAs semi-insulating substrate and the dipole barrier. Such a buffer layer is necessary to provide a sufficiently high breakdown voltage (i.e., to prevent ionization of trapped carriers in the GaAs semi-insulating substrate). The pure buffer layer itself has no trapped charges that would be released at high electric fields, and is thick enough to bring about only weak electric fields in the underlying substrate.

A main object of the present invention is to provide a field effect semiconductor device that can isolate electron flow substantially only to the channel region of the device, even under high voltage conditions (i.e., 20–200 volts). In one embodiment, the device includes a substrate, a dipole barrier formed on the substrate, a channel layer formed on the dipole barrier, and source, gate and drain electrodes formed on the channel layer. The dipole barrier is charge neutral and provides a potential barrier (eV) and a maximum electric field (V/cm) sufficient to confine electrons to the channel layer. A potential barrier height of at least about 0.8 eV would be desired in most cases. The maximum electric field will vary depending upon the intended operating voltage to be applied during use of the device.

The dipole barrier can be established in several ways. In one embodiment of the present invention, the dipole barrier is formed by a depleted $p^+$-type layer formed on the substrate and a depleted $n^+$-type layer formed on the depleted $p^+$-type layer. An n-type channel layer is then formed on the depleted $n^+$-type layer. The depleted $p^+$-type and $n^+$-type layers collectively form the dipole barrier.

In the context of the dipole barrier, use of "$p^+$" herein defines a depleted layer or area of ionized acceptors, and "$n^+$" defines a depleted layer or area of ionized donors. The term depleted means that there are no mobile carriers.

In another embodiment of the present invention, the dipole barrier is formed by only a depleted $p^+$-type layer formed on the substrate. The depleted p$^+$-type layer causes an adjacent region of the n-type channel layer to become depleted, with the net effect being the formation of a dipole barrier between the substrate and the n-type channel layer. In the case of a p-channel device, doping would be reversed throughout the device.

In another embodiment of the present invention, the dipole barrier is formed by a layer of dissimilar material interposed between the substrate and the channel layer. This layer of dissimilar material is lattice mismatched with respect to the substrate, such that a piezoelectric field is created in the layer itself. This piezoelectric field is sufficient to overcome the effects of any drain to source fringing electric fields. Moreover, the piezoelectric effect in this layer also increases its barrier potential in proportion to its thickness, such that parasitic current flow in the underlying substrate is avoided.

When GaAs is used as the substrate material, the device preferably also includes a high purity GaAs buffer layer interposed between the substrate and the dipole barrier. As explained above, the buffer layer reduces the fringing electric field below it, and prevents ionization of trapped carriers in the underlying GaAs substrate, thereby increasing the breakdown voltage of the substrate.

BRIEF DESCRIPTION OF THE DRAWINGS

FIGS. 5a and 5b show equivalent gate structures in accordance with the prior art; and FIGS. 6a and 6b show equivalent gate structures in accordance with the present invention.

DETAILED DESCRIPTION OF THE PREFERRED EMBODIMENTS

Figure 1:
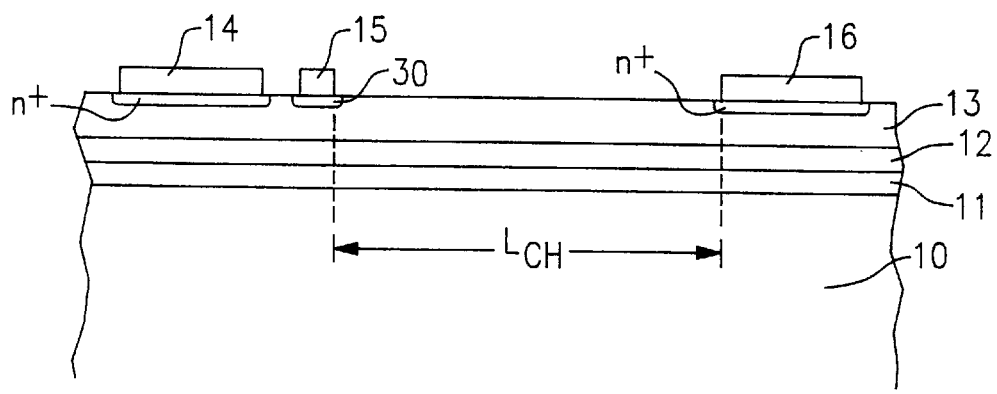
FIG. 1 is a cross-sectional view of a lateral field effect transistor device in accordance with one embodiment of the present invention.

FIG. 1 is a cross-sectional view of a n-channel lateral field effect transistor (FET) device in accordance with one embodiment of the present invention (the dielectric passivation layer is omitted for clarity). The device includes a semi-insulating substrate 10, which can be formed of any type of semiconductor material capable of providing a breakdown voltage high enough to handle the drain to source voltage applied to the device during use.

A depleted p$^+$-type layer 11 is formed on semi-insulating substrate 10, and a depleted n$^+$-type layer 12 is formed on depleted p$^+$-type layer 11. These layers collectively form a dipole barrier that provides a built-in potential barrier and a maximum electric field sufficient to confine electrons to the channel layer 13. In order for these layers to function as a dipole barrier, they must cooperate to insure that the dipole barrier itself is essentially charge neutral. More specifically, the total sheet charge of the depleted p$^+$-type layer 11 must be substantially equal to the total sheet charge of the n$^+$-type layer 12. In the case of p$^+$-type layer 11, the total sheet charge Qp (C/cm$^2$) of that layer is the product of (1) the total number density of acceptors N$_A$ (cm$^{-3}$) in that layer, (2) the thickness Tp (cm) of that layer, and (3) the fundamental charge "e" (C). Similarly, in the case of n$^+$-type layer 12, the total sheet charge Qn (C/cm$^2$) of that layer is the product of (1) the total number density of donors N$_D$ (cm$^{-3}$) in that layer, (2) the thickness Tn (cm) of that layer, and (3) the fundamental charge "e" (C).

For these layers to act collectively as a dipole barrier, Qp must be substantially equal to Qn. For example, the layers could be formed to the same thickness and dopant concentration in order to make Qp≈Qn. If the thickness of one layer is increased relative to the other, then the dopant concentration of that layer would have to be decreased to achieve the dipole condition where Qp≈Qn. The inventors presently believe that the difference between Qp and Qn should not exceed about 10% of the total sheet charge of the channel layer used in connection therewith, in order to provide a secure dipole barrier.

The channel layer 13 is formed on depleted n$^+$-type layer 12 to provide the active region of the device where the flow of electrons can be controlled. This layer is made of n-type material and the total sheet charge of this layer can be selected depending upon the specific application for which the device is designed. For example, in high voltage applications approaching 200 volts, it is desirable to form the channel layer with a total sheet charge on the order of 1×10$^{-7}$ C/cm$^2$ (e.g., 1.6×10$^{-7}$ C/cm$^2$) so that the amount of current flowing through the channel does not cause excessive heat to form in the device. Such a high voltage, low current device would be particularly suitable for high power RF applications, since the impedance of such a FET device could be matched easily to the impedance of the load in these types of applications.

Source 14, gate 15 and drain 16 electrodes are formed on channel layer 13 in a known manner. An n$^+$ region is formed under the source and drain electrodes. This region can be formed as a result of alloying between the materials of the electrodes (e.g., GeAu) and the material of the channel layer. This region can also be formed by ion implantation or epitaxial growth.

A depleted region of ionized acceptors 30 is formed under gate electrode 15, in order to set up a reduced built-in electric field around the gate. This reduced built-in electric field will prevent tunneling of electrons out of the gate during pinch off. This region can also be formed by ion implantation or epitaxial growth.

Figure 2:
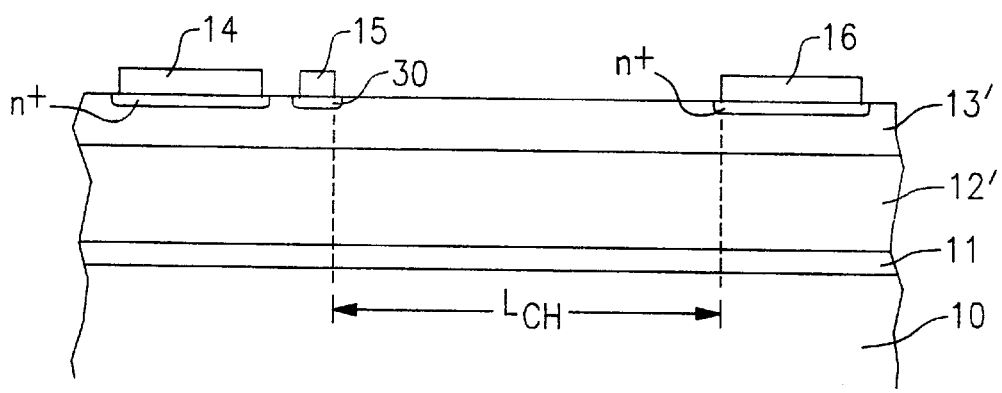
FIG. 2 is a cross-sectional view of a lateral field effect transistor device in accordance with another embodiment of the present invention.

FIG. 2 is a cross-sectional view of a field effect transistor device in accordance with another embodiment of the present invention. This embodiment differs from the embodiment explained above in that a single p$^+$-type layer 11 is formed on semi-insulating substrate 10. A thick layer of n-type material is then formed on p$^+$-type layer 11. The p$^+$-type layer 11 depletes a substantial immediately adjacent portion 12' of the n-type layer, which in turn depletes p$^+$-type layer 11. These two layers function as the dipole barrier in the same manner as described above. The remainder of the n-type layer functions as the channel layer 13'. It can be seen from FIG. 2 that the thickness of the depleted n-type layer 12' is much greater than the thickness of p$^+$-type layer 11, since the dopant concentration of n-type layer 12' is less than that of p$^+$-type layer 11. Again, to achieve the dipole condition Qp should be substantially equal to Qn.

Figure 3:
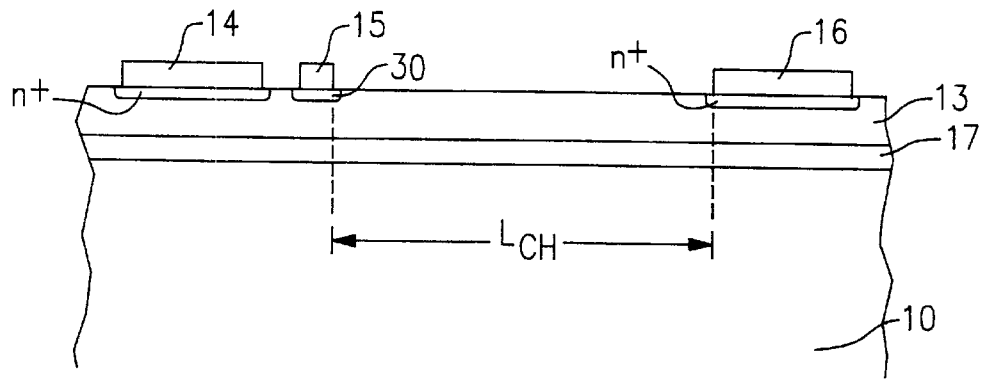
FIG. 3 is a cross-sectional view of a lateral field effect transistor device in accordance with another embodiment of the present invention.

FIG. 3 is a cross-sectional view of a field effect transistor device in accordance with another embodiment of the present invention. This embodiment differs from the embodiments explained above in that the dipole barrier is established by a single layer of dissimilar material 17. Layer 17 is applied in such a fashion that lattice mismatch occurs between it and the underlying substrate. The lattice mismatch causes strain in layer 17, which in turn causes a piezoelectric effect in the layer. The piezoelectric effect sets up a piezoelectric field, which can be designed to be of sufficient strength to set up a potential barrier and to counter drain to source fringing electric fields in the underlying substrate. The piezoelectric effect in layer 17 increases the potential barrier provided by the layer in proportion to its thickness. The piezoelectric field and increased potential barrier prevent parasitic current flow in the underlying substrate.

While many materials could be used for layer 17, GaInP works particularly well. A $Ga_{0.7}In_{0.3}P$ material composition ($Ga_{0.51}In_{0.49}P$ is standard for lattice matching) would work well when deposited on a GaAs semi-insulating substrate having a (111)A crystal orientation. Increasing the amount of Ga provides enough of a lattice mismatch that a large strain, and thus a strong piezoelectric field, would be produced in the GaInP layer. The thickness of the layer should be at least 100 Å to prevent tunneling of electrons through the layer.

The dipole barrier concept is believed to be applicable to all types of semiconductor materials. When using a semiconductor material such as SiC that has a breakdown voltage high enough to satisfy the requirements of high voltage applications, the dipole barrier can be formed directly on the SiC substrate itself. However, when using a material such as GaAs, which has a relatively low breakdown voltage, the inventors recognized that it is necessary to employ a buffer layer between the semi-insulating substrate and the dipole barrier. The buffer layer provides the device with a breakdown voltage high enough to handle high voltage applications.

Figure 4:
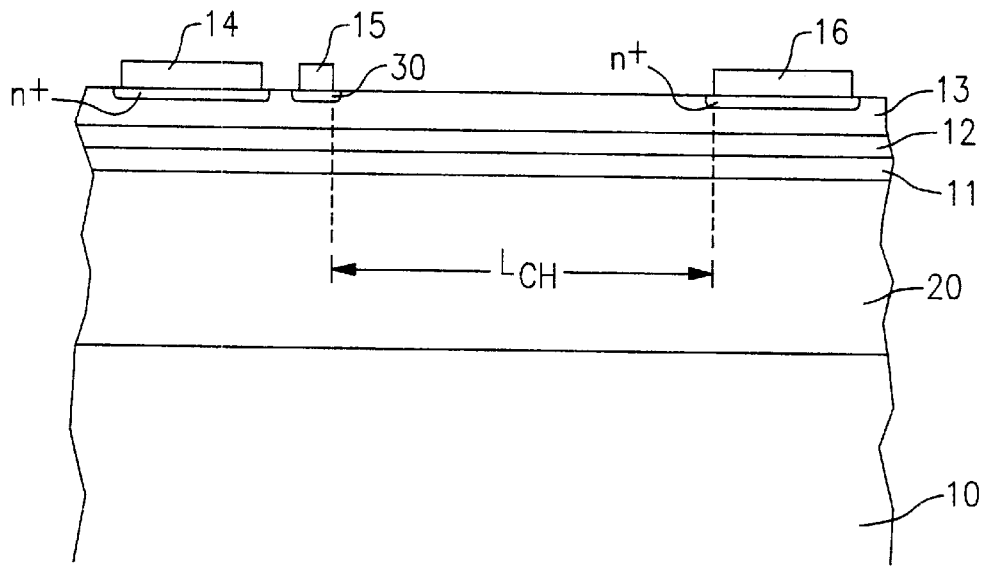
FIG. 4 is a cross-sectional view of a lateral field effect transistor device in accordance with another embodiment of the present invention.

FIG. 4 is a cross-sectional view of a field effect transistor device in accordance with another embodiment of the present invention, wherein GaAs is used as the substrate material. Like reference numerals represent like components in FIGS. 1–4. The FET device shown in FIG. 4 is basically the same as the device shown in FIG. 1, except that a substantially pure, relatively thick buffer layer 20 is interposed between semi-insulating substrate 10 and the depleted $p^+$-type layer 11 that forms one-half of the dipole barrier. A substantially pure semi-conductor layer is one that has substantially no free nor trapped charge carriers. In the case of GaAs, a substantially pure buffer layer has a residual impurity level of no more than about $1 \times 10^{15}$ cm$^{-3}$. The thickness of buffer layer 20 should be selected depending upon the desired breakdown voltage. The inventors have demonstrated that buffer layers of about 5 microns thickness can provide a breakdown voltage of at least 80 volts with a gate to drain separation (channel length, $L_{CH}$) of 10 microns. A breakdown voltage of about 200 volts could be achieved with a buffer layer of about 10 micron thickness and a gate to drain channel length of 15 microns.

In addition to the dipole barrier being substantially charge neutral, it must provide a sufficiently high potential barrier and maximum electric field in the device to more than offset the fringing electric fields that would otherwise occur in the buffer layer. Again, while the buffer layer increases the breakdown voltage of the GaAs semi-insulating substrate, it also provides a path for fringing electric fields and thus parasitic current flow at or near pinchoff.

The fringing electric field ($E_F$) will extend from the drain electrode 16 to the gate electrode 15 in the buffer layer 20, and will assume a nominally semi-circular shape. Accordingly, the fringing electric field can be approximated as follows:

$$E_F \approx V_{dg}/(\pi)(\frac{1}{2})(L_{CH})$$

wherein $V_{dg}$ is the voltage applied to the drain electrode and $L_{CH}$ is the channel length.

The electric field provided by the dipole layer ($E_{DL}$) must be large enough to more than counteract the fringing electric field. A good estimation is that $E_{DL} \geq 2 E_F$. The electric field provided by the dipole layer is dependent directly upon the sheet charge of the $p^+$ and $n^+$ layers that make up the dipole layer. Since $E_{DL}$ is maximum at the interface between the $p^+$ and $n^+$ layers, $E_{DL}$ can be approximated with reference to one of those two layers as follows:

$$E_{DL} \approx Q/\in$$

wherein Q is the total sheet change of layer 11 or 12, and $\in$ is the dielectric constant of the material making up the layers.

In the case of a GaAs MESFET that is to handle voltage levels of about 200V, one could pick an appropriate channel length of, say, 15 $\mu$m and approximate $E_F$ as follows:

$$E_F \approx 200V/(\pi)(15 \times 10^{-4} \text{ cm})(\frac{1}{2}) \approx 85 \text{ kV/cm}$$

Then, making the strength of $E_{DL}$ twice that of $E_F$ (to be absolutely certain $E_F$ is suppressed), the total sheet charge of layer 11 or 12 would be approximated as follows:

$$E_{DL} \approx 2 \cdot E_F = (2)(85 \text{ kV/cm}) = 170 \text{ kV/cm}$$

$$170 \text{ kV/cm} \approx Q/\in \approx Q/1.15 \times 10^{-12} \text{ F/cm (i.e., dielectric constant of GaAs)}$$

$$Q \approx (170 \text{ kV/cm})(1.15 \times 10^{-12} \text{ F/cm}) \approx 2 \times 10^{-7} \text{ C/cm}^2$$

Based on the above exemplary calculations, the dipole layer would be constructed such that $Qp \approx Qn \approx 2 \times 10^{-7}$ C/cm$^2$. The easiest structure for the dipole layer would include layers of equal thickness and dopant concentration, e.g., $N=3.125 \times 10^{17}$/cm$^3$ and $T=4 \times 10^{-6}$ cm. Such a dipole layer would present a potential barrier (barrier height, $\Delta E_c$) approximated as follows:

$$\Delta E_c \approx E_{DL} \cdot T$$

$$\Delta E_c \approx (170 \text{ kV/cm})(4 \times 10^{-6} \text{ cm})$$

$$\Delta E_c \approx 0.7 \text{ eV}$$

Specific examples of GaAs MESFETs will now be explained with reference to the structure shown in FIG. 4 (the dipole barrier is omitted in Examples 1 and 2).

EXAMPLE 1

A commercially available 50 micron thick GaAs wafer is used as the semi-insulating substrate 10. A GaAs layer is deposited on the substrate 10 by the Organometallic Vapor Phase Epitaxial (OMVPE) method to form the buffer layer 20. The growth temperature is about 600° C., and triethylgallium and arsine are used as precursors. The buffer layer has a thickness of 5 microns and a purity of $N_D < 10^{15}$ cm$^{-3}$. A 0.25 micron thick GaAs channel layer 13, having a total number density of donors of $N_D \approx 3 \times 10^{16}$ cm$^{-3}$, is formed on buffer layer 20 by OMVPE, and the source 14, gate 15, and drain 16 electrodes are formed on the channel layer by conventional lithographic/metallization techniques to form a MESFET device. The length of the channel ($L_{CH}$) between the gate and drain electrodes is set to 15 microns.

This device is able to withstand drain to gate voltages as high as 110 volts, but is unable to achieve channel pinchoff due to parasitic current flow in the GaAs buffer layer 20.

EXAMPLE 2

The steps of Example 1 are repeated, except that the buffer layer is formed to a thickness of 8 microns. This device is able to withstand drain to gate voltages as high as 170 volts, but is unable to achieve channel pinchoff at high drain-source voltage due to parasitic current flow in the GaAs buffer layer 20.

EXAMPLE 3

The steps of Example 2 are repeated, except a dipole barrier is formed by OMVPE between the buffer layer 20 and the channel layer 13. The dipole barrier includes a depleted p$^+$-type layer 11 formed on the buffer layer 20 and a depleted n$^+$-type layer 12 formed on the depleted p$^+$-type layer 11. Each doped layer is formed to a thickness of 400 Angstroms. The p$^+$-type layer is doped to a level of $4\times10^{17}$ cm$^{-3}$ and the n$^+$-type layer is doped to a level of $4\times10^{17}$ cm$^{-3}$. The total sheet charge of the p$^+$-type layer is substantially equal to the total sheet charge of the n$^+$-type layer, so that the net charge effect of the overall dipole barrier is substantially neutral. This device is able to withstand drain to gate voltages as high as 170 volts (due to the buffer layer) and achieve channel pinchoff at a negative gate voltage of 7–8 volts, because the dipole barrier sets up about a 1 eV potential barrier and a maximum electric field of about 220 kV/cm. This dipole barrier effectively eliminates parasitic current flow in the GaAs buffer layer 20, and confines all electrons to the channel layer of the device.

While each of the Examples uses OMVPE to form the buffer layer, dipole barrier and channel layer, it will be appreciated that other methods (e.g., molecular beam epitaxy) could be employed. For example, to allow mass production of the device, it is envisioned that OMVPE will be used to form the buffer layer and then ion implantation will be used to form the dipole and channel layers.

During the course of their work the inventors also recognized that the maximum electric field at pinchoff occurred on the drain side of the gate electrode. The inventors also recognized that for very high voltage applications (e.g., 100–200 volts) it may be desirable to modify the structure of the gate to help the device attain sufficiently high breakdown voltage levels. FIGS. 5a and 5b show two conventional techniques for modifying the gate structure of a field effect transistor to increase breakdown voltage. In FIG. 5a, a depleted p$^+$ region (in a n-channel device) is formed symmetrically under the gate electrode, and in FIG. 5b the gate electrode is positioned symmetrically within a recess formed in the surface of the channel layer.

Realizing that neither of these known structures was suitable for very high voltage applications, the inventors developed the modified gate structures shown in FIGS. 6a and 6b. In FIG. 6a, a depleted region of ionized acceptors 30 is formed under the gate electrode 15 in an asymmetric manner, and in FIG. 6b the gate electrode 15 is positioned asymmetrically within a recess 31 formed in the surface of the channel layer 13. In both cases, the gate electrode 15 is positioned closer to the source end of the gate (to the left in the drawings) than the drain end of the gate (to the right in the drawings). This asymmetric positioning of the gate electrode compensates for the non-uniform electric fields on the opposite sides of the gate electrode. It is preferred that the drain side of region 30/recess 31 be extended, with respect to a symmetric gate structure, ½ the length (Lg) of gate electrode 15. More specifically, it is preferred that the length (L1) of region 30/recess 31 from the midpoint (M) of gate electrode 15 to the drain-side end of region 30/recess 31 is longer than the length (L2) of region 30/recess 31 from the midpoint (M) of gate electrode 15 to the source-side end of region 30/recess 31 by a distance of ½ Lg.

While the present invention has been described with reference to preferred embodiments thereof, it will be understood by those skilled in the art that various modifications and the like could be made thereto without departing from the spirit and scope of the invention as defined in the following claims.

What is claimed is:

1. A field effect transistor device, comprising:
    a substrate;
    an undoped buffer layer formed on said substrate;
    a dipole barrier formed on said buffer layer, said dipole barrier comprising a depleted p$^+$-type layer, having a sheet charge Qp, and a depleted n$^+$-type layer, having a sheet charge Qn, and Qp is substantially equal to Qn;
    a channel layer formed on said dipole barrier; and
    source, gate and drain electrodes formed on said channel layer;
    wherein said dipole barrier provides a potential barrier and a maximum electric field sufficient to confine electrons to said channel layer.

2. The field effect transistor device according to claim 1, wherein said channel layer is formed of n-type material and said dipole barrier comprises a depleted p$^+$-type layer, having a sheet charge Qp, formed on said substrate, and a depleted n$^+$-type layer, having a sheet charge Qn, formed on said depleted p$^+$-type layer, and Qp is substantially equal to Qn.

3. The field effect transistor device according to claim 1, wherein said channel layer is formed of p-type material and said dipole barrier comprises a depleted n$^+$-type layer, having a sheet charge Qn, formed on said substrate, and a depleted p$^+$-type layer, having a sheet charge Qp, formed on said depleted n$^+$-type layer, and Qn is substantially equal to Qp.

4. The field effect transistor device according to claim 2, wherein said depleted p$^+$-type layer is formed as a separate layer and said depleted n$^+$-type layer is induced, by the presence of said depleted p$^+$-type layer, in a n-type region of said channel layer immediately adjacent said depleted p$^+$-type layer.

5. The field effect transistor device according to claim 3, wherein said depleted n$^+$-type layer is formed as a separate layer and said depleted p$^+$-type layer is induced, by the presence of said depleted n$^+$-type layer, in a p-type region of said channel layer immediately adjacent said depleted n$^+$-type layer.

6. The field effect transistor device according to claim 1, wherein said dipole barrier is formed directly on said buffer layer.

7. The field effect transistor device according to claim 1, wherein said channel layer is formed directly on said dipole barrier.

8. The field effect transistor device according to claim 6, wherein said channel layer is formed directly on said dipole barrier.

9. The field effect transistor device according to claim 1, wherein said depleted p$^+$-type layer and said depleted n$^+$-type layer directly contact one another.

10. The field effect transistor device according to claim 6, wherein said depleted p$^+$-type layer and said depleted n$^+$-type layer directly contact one another.

11. The field effect transistor device according to claim 7, wherein said depleted p$^+$-type layer and said depleted n$^+$-type layer directly contact one another.

12. The field effect transistor device according to claim 8, wherein said depleted p$^+$-type layer and said depleted n$^+$-type layer directly contact one another.

13. The field effect transistor device according to claim 1, wherein said buffer layer is formed directly on said substrate.

14. The field effect transistor device according to claim 1, wherein said buffer layer is substantially pure.

15. The field effect transistor device according to claim 14, wherein said buffer layer has a residual impurity level of no more than about $1\times10^{15}$ cm$^{-3}$.

16. The field effect transistor device according to claim 1, wherein said substrate is semi-insulating.

17. A field effect transistor device, comprising:

a GaAs semi-insulating substrate;

an undoped GaAs buffer layer formed on said GaAs semi-insulating substrate;

a dipole barrier formed on said undoped GaAs buffer layer, said dipole barrier comprising a depleted p$^+$-type layer, having a sheet charge Qp, and a depleted n$^+$-type layer, having a sheet charge Qn, and Qp is substantially equal to Qn;

a channel layer formed on said dipole barrier; and source, gate and drain electrodes formed on said channel layer;

wherein said dipole barrier provides a potential barrier and a maximum electric field sufficient to confine electrons to said channel layer.

18. The field effect transistor device according to claim 17, wherein said channel layer is formed of n-type GaAs and said dipole barrier comprises a depleted p$^+$-type GaAs layer, having a sheet charge Qp, formed on said high purity GaAs buffer layer, and a depleted n$^+$-type GaAs layer, having a sheet charge Qn, formed on said depleted p$^+$-type GaAs layer, and Qp is substantially equal to Qn.

19. The field effect transistor device according to claim 17, wherein said channel layer is formed of p-type GaAs and said dipole barrier comprises a depleted n$^+$-type GaAs layer, having a sheet charge Qn, formed on said high purity GaAs buffer layer, and a depleted p$^+$-type GaAs layer, having a sheet charge Qp, formed on said depleted n$^+$-type GaAs layer, and Qn is substantially equal to Qp.

20. The field effect transistor device according to claim 18, wherein said depleted p$^+$-type GaAs layer is formed as a separate layer and said depleted n$^+$-type GaAs layer is induced, by the presence of said depleted p$^+$-type GaAs layer, in a n-type region of said GaAs channel layer immediately adjacent said depleted p$^+$-type GaAs layer.

21. The field effect transistor device according to claim 19, wherein said depleted n$^+$-type GaAs layer is formed as a separate layer and said depleted p$^+$-type GaAs layer is induced, by the presence of said depleted n$^+$-type GaAs layer, in a p-type region of said GaAs channel layer immediately adjacent said depleted n$^+$-type GaAs layer.

22. The field effect transistor device of claim 1, wherein said gate electrode is formed on said channel layer between the source and drain electrodes, and said device further comprises a depleted region of ionized acceptors or donors formed under said gate electrode;

wherein said gate electrode has a length, Lg, and said region has a length, L1, measured from the midpoint of said gate electrode to the drain electrode end of said region and a length, L2, measured from the midpoint of said gate electrode to the source electrode end of said region, and L1 is greater than L2 by at least ½ Lg.

23. The field effect transistor device of claim 1, wherein said gate electrode is formed in a recess of said channel layer between the source and drain electrodes, and wherein said gate electrode has a length, Lg, and said recess has a length, L1, measured from the midpoint of said gate electrode to the drain electrode end of said recess and a length, L2, measured from the midpoint of said gate electrode to the source electrode end of said recess, and L1 is greater than L2 by at least ½ Lg.

24. The field effect transistor device of claim 1, wherein said substrate, said dipole barrier and said channel layer comprise GaAs.

25. The field effect transistor device of claim 1, wherein said substrate, said dipole barrier and said channel layer comprise InP.

26. The field effect transistor device of claim 1, wherein said substrate, said dipole barrier and said channel layer comprise SiC.

27. The field effect transistor device of claim 1, wherein said substrate, said dipole barrier and said channel layer comprise GaN.

28. The field effect transistor device of claim 17, wherein said gate electrode is formed on said channel layer between the source and drain electrodes, and said device further comprises a depleted region of ionized acceptors or donors formed under said gate electrode, wherein said gate electrode has a length, Lg, and said region has a length, L1, measured from the midpoint of said gate electrode to the drain electrode end of said region and a length, L2, measured from the midpoint of said gate electrode to the source electrode end of said region, and L1 is greater than L2 by at least ½ Lg.

29. The field effect transistor device of claim 17, wherein said gate electrode is formed in a recess of said channel layer between the source and drain electrodes, and wherein said gate electrode has a length, Lg, and said recess has a length, L1, measured from the midpoint of said gate electrode to the drain electrode end of said recess and a length, L2, measured from the midpoint of said gate electrode to the source electrode end of said recess, and L1 is greater than L2 by at least ½ Lg.

30. The field effect transistor device according to claim 17, wherein said dipole barrier is formed directly on said undoped GaAs buffer layer.

31. The field effect transistor device according to claim 17, wherein said channel layer is formed directly on said dipole barrier.

32. The field effect transistor device according to claim 30, wherein said channel layer is formed directly on said dipole barrier.

33. The field effect transistor device according to claim 17, wherein said depleted p$^+$-type layer and said depleted n$^+$-type layer directly contact one another.

34. The field effect transistor device according to claim 30, wherein said depleted p$^+$-type layer and said depleted n$^+$-type layer directly contact one another.

35. The field effect transistor device according to claim 31, wherein said depleted p$^+$-type layer and said depleted n$^+$-type layer directly contact one another.

36. The field effect transistor device according to claim 32, wherein said depleted p$^+$-type layer and said depleted n$^+$-type layer directly contact one another.

37. The field effect transistor device according to claim 17, wherein said buffer layer is formed directly on said substrate.

38. The field effect transistor device according to claim 17, wherein said buffer layer is substantially pure.

39. The field effect transistor device according to claim 38, wherein said buffer layer has a residual impurity level of no more than about $1\times10^{15}$ cm$^{-3}$.

* * * * *